United States Patent
Puranik

(10) Patent No.: US 8,917,111 B1
(45) Date of Patent: Dec. 23, 2014

(54) CONFIGURATION OF PROGRAMMABLE INTEGRATED CIRCUITS

(71) Applicant: Xilinx, Inc., San Jose, CA (US)

(72) Inventor: Kiran S. Puranik, Fremont, CA (US)

(73) Assignee: Xilinx Inc., San Jose, CA (US)

( * ) Notice: Subject to any disclaimer, the term of this patent is extended or adjusted under 35 U.S.C. 154(b) by 140 days.

(21) Appl. No.: 13/788,225

(22) Filed: Mar. 7, 2013

(51) Int. Cl.
*H03K 19/173* (2006.01)
*H03K 19/177* (2006.01)

(52) U.S. Cl.
CPC .... *H03K 19/17736* (2013.01); *H03K 19/17744* (2013.01)
USPC ................................ 326/38; 326/41; 326/47

(58) Field of Classification Search
CPC ................... H03K 19/17736; H03K 19/17744
USPC ................................. 326/37–41, 47
See application file for complete search history.

(56) References Cited

U.S. PATENT DOCUMENTS

| | | | |
|---|---|---|---|
| 7,932,743 B1 | 4/2011 | Stewart et al. | |
| 2009/0134906 A1* | 5/2009 | Kelem et al. | 326/9 |
| 2011/0199117 A1* | 8/2011 | Hutchings et al. | 326/38 |

OTHER PUBLICATIONS

Altera, *Configuration via Protocol (CvP) Implementation in Altera FPGAs*, Jul. 2012, pp. 1-46, Altera, San Jose, California, USA.

* cited by examiner

*Primary Examiner* — Jason M Crawford
(74) *Attorney, Agent, or Firm* — LeRoy D. Maunu

(57) ABSTRACT

Approaches for configuring programmable resources of a programmable IC are disclosed. A first set of configuration data is loaded using a configuration port of the programmable IC, which also includes input/output (I/O) ports. Programmable resources are configured according to the first set of configuration data to implement a master data link circuit and at least one slave data link circuit. The master data link circuit includes a hardwired communication circuit, and a set of the programmable resources arranged to form a communication control circuit configured to control the communication circuit to provide a data link for communicating data via one of the I/O ports. A second set of configuration data is loaded using the master data link circuit. Programmable resources of the programmable IC are configured according to the second set of configuration data to implement a logic circuit configured to communicate data via the slave data link circuit.

20 Claims, 10 Drawing Sheets

CONFIGURATION OF PROGRAMMABLE INTEGRATED CIRCUITS

TECHNICAL FIELD

The disclosure generally relates to programmable integrated circuits (IC), and more particularly, to the configuration of programmable ICs.

BACKGROUND

Programmable ICs are user configurable and capable of implementing digital logic operations. There are several types of programmable ICs, including Complex Programmable Logic Devices (CPLDs) and Field Programmable Gate Arrays (FPGAs), for example. CPLDs include function blocks based on programmable logic array (PLA) architecture and programmable interconnect lines to route and transmit signals between the function blocks. FPGAs include configurable logic blocks (CLBs), input output blocks (IOBs), and programmable interconnect lines that route and transmit signals between the CLBs, between the CLBs and IOBs, and between the IOBs. Each CLB includes look-up tables and other configurable circuitry that are programmable to implement logic functions. The function blocks of CPLDs, CLBs of FPGAs, and interconnect lines are configured by data stored in a configuration memory of the respective devices.

The programmable interconnects and programmable logic are typically programmed by loading a set of configuration data (referred to as a configuration data stream) into internal configuration memory cells that define how the programmable elements are configured. Electronic devices implemented using a programmable IC often include a non-volatile memory that is used to store a configuration data stream. Traditionally, an entire configuration data stream for complete configuration of a programmable IC is retrieved from the non-volatile memory via a configuration port when the programmable IC is powered on. However, due to the large number of programmable resources included in current programmable ICs, the amount of time needed for retrieval of configuration data using the configuration port may be prohibitively long for many applications.

SUMMARY

A method is provided for configuring programmable resources of a programmable IC. A first set of configuration data is loaded into the programmable IC using a configuration port of the programmable IC. The programmable IC includes a plurality of input/output (I/O) ports and the configuration port. Programmable resources of the programmable IC are configured according to the first set of configuration data to implement a master data link circuit and at least one slave data link circuit. The master data link circuit includes a communication circuit hardwired in the programmable IC, and a set of the programmable resources of the programmable IC arranged to form a communication control circuit configured to control the communication circuit to provide a data link for communicating data via a first one of the plurality of I/O ports. A second set of configuration data is loaded using the master data link circuit. Programmable resources of the programmable IC are configured according to the second set of configuration data to implement a first logic circuit that is configured to communicate data via the slave data link circuit.

In another method for generation of configuration data for a programmable IC, in response to receiving a circuit design, a first set of configuration data is generated. The first set of configuration data is configured to cause programmable resources of a programmable IC, when configured with the first set of configuration data, to implement the circuit design. A second set of configuration data is generated. The second set of configuration data is configured to cause programmable resources of the programmable IC to implement a data link circuit. The second set of configuration data is further configured to cause programmable resources of the programmable IC to use the data link circuit to retrieve the first set of configuration data from a non-volatile memory coupled to the programmable IC as a contiguous sequence of data in a burst mode. The second set of configuration data is further configured to cause programmable resources of the programmable IC to program programmable resources of the programmable IC using the first set of configuration data. The first and second sets of configuration data are stored in the non-volatile memory.

In an example system, an IC includes a plurality of I/O ports, a configuration control circuit, a communication circuit, and a set of programmable resources. The programmable resources are programmed to implement a communication control circuit. The configuration control circuit configured to program the programmable resources in response to a set of configuration data. The communication circuit is configured to communicate data over one of the plurality of I/O ports. The communication circuit implemented by the programmable resources includes a first circuit and a second circuit. The first circuit is coupled to the I/O port and configured to communicate data over the I/O port according to a communication protocol. The second circuit is coupled to the first circuit and is configured to provide data from the first circuit to the configuration control circuit in response to the communication control circuit operating in a first mode. The second circuit is further configured to provide data from the communication control circuit to the configuration control circuit in response to the communication control circuit operating in a second mode. While operating in the second mode, the communication control circuit is configured to cause the communication circuit to receive the set of configuration data in a burst mode and provide the set of configuration data to the communication control circuit. The communication control circuit is further configured to communicate the set of configuration data to the configuration control circuit via the second circuit of the communication circuit.

Other approaches will be recognized from consideration of the Detailed Description and Claims, which follow.

BRIEF DESCRIPTION OF THE DRAWINGS

Various aspects of the method and system will become apparent upon review of the following detailed description and upon reference to the drawings, in which.

DETAILED DESCRIPTION

One or more methods are disclosed for configuring a programmable IC over a plurality of configuration stages. A first configuration data stream is used to implement a Peripheral Component Interconnect Express (PCIe) control circuit for a first PCIe data link in programmable resources of the programmable IC. A second configuration data stream is input to the programmable IC via the PCIe data link. The second configuration data stream is used to configure programmable resources of the programmable IC. Use of a PCIe data link allows configuration data to be transferred to a programmable IC at much higher data rates than those typically available via the configuration port of the programmable IC.

The PCIe control circuit is configured to further increase the data rate by configuring the PCIe data link to receive the configuration data stream in large contiguous sequences (e.g., burst mode). For instance, in some implementations, the PCIe control circuit is configured to operate the PCIe circuit in a direct memory access (DMA) mode that provides data transfers of the configuration data stream with direct memory access to a set of buffers in the PCIe control circuit. In DMA mode, a PCIe data line can operate in a burst mode to communicate a large number of data blocks (e.g., data packets) as a contiguous sequence (e.g., not interrupted by the communication of other data blocks not in the sequence). Burst mode transfers exert exclusive control over a data channel until all data packets in a burst have been communicated. In contrast, non-burst mode transfers only exert control over a data channel for the communication of an individual data packet. Burst mode transfers make more efficient use of a communication channel and achieve higher data rates. Using DMA burst mode, the time taken to transfer a configuration data stream to a programmable IC may be reduced.

Figure 1:
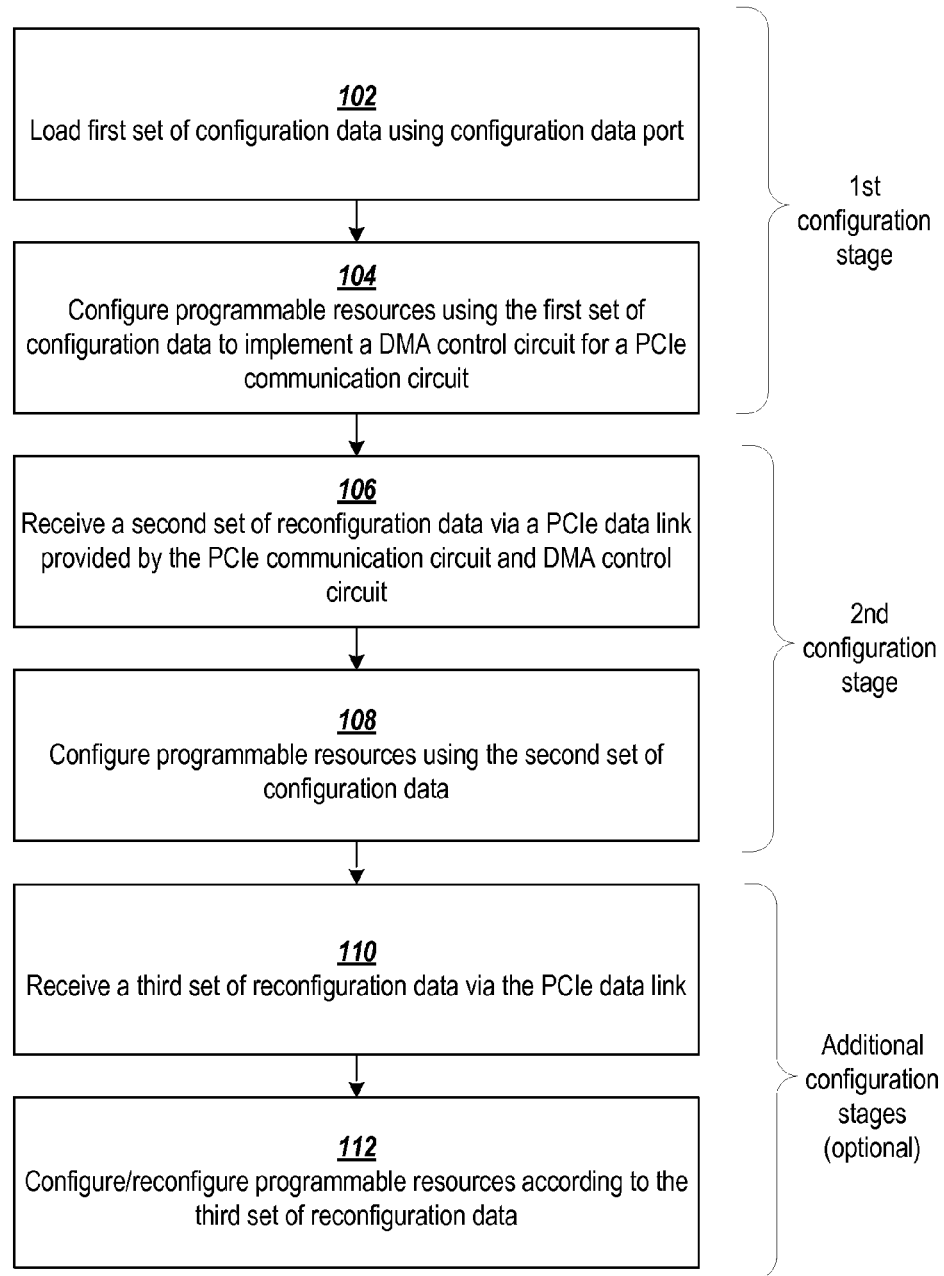
FIG. 1 shows a flowchart of a process for configuration of a programmable IC.

Turning now to the figures, FIG. 1 shows a flowchart of an example process for configuration of a programmable IC. Programmable resources are configured over a plurality of stages, each stage performing partial configuration/reconfiguration of programmable resources. Partial configuration/reconfiguration configures some programmable resources of a programmable IC without changing the configuration of other programmable resources of the programmable IC.

A first configuration stage is performed at blocks 102 and 104. At block 102, a first set of configuration data is loaded into a programmable IC using a configuration data port. At block 104, programmable resources are configured using the first set of configuration data to implement a DMA controller for a PCIe communication circuit. A second configuration stage is performed at blocks 106 and 108. At block 106, a second set of configuration data is received using a PCIe data link provided by the DMA controller and PCIe communication circuit. Programmable resources are configured using the second set of configuration data at block 108. As an example, in some implementations, a large set of configuration data corresponding to an application circuit design is transferred to a programmable IC as the second set of configuration data. Because this set of configuration data is transferred using PCIe, configuration time for the circuit design is reduced.

In some implementations, additional configuration stages may be performed to transfer additional configuration data to the programmable IC. For example, in some implementations, a first portion of a circuit design is loaded using the second set of configuration data, and the remaining portion of a circuit design is loaded using one or more additional sets of configuration data. As another example, a first circuit of a circuit design, which was loaded in the second configuration stage, may be replaced with a second circuit that is loaded in a third configuration stage. An optional, additional configuration stage is performed at blocks 110 and 112. At block 110, a third set of configuration data is received using the PCIe data link. A portion of programmable resources are configured or reconfigured according to the third set of configuration data.

Figure 2:
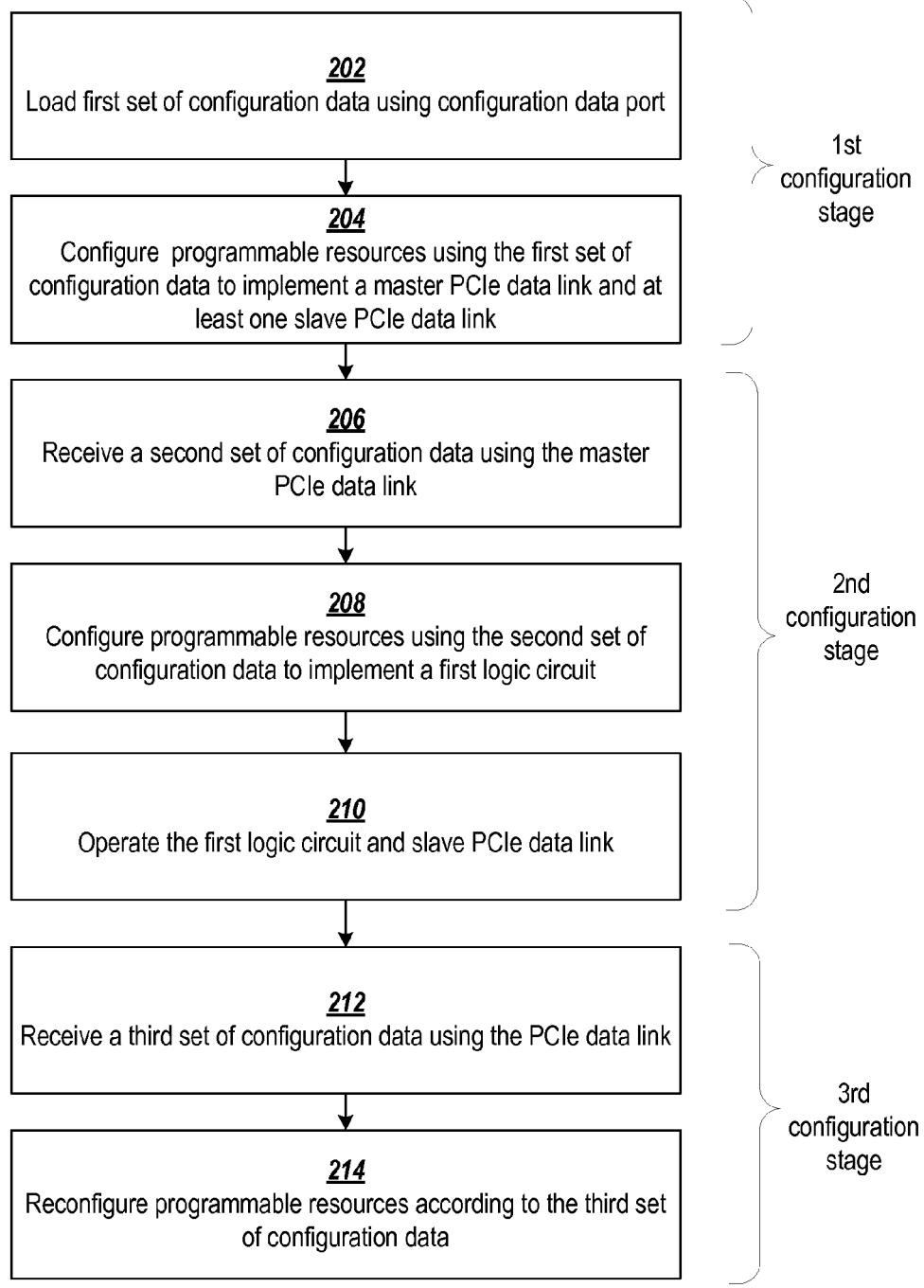
FIG. 2 shows a flowchart of another process for configuration of a programmable IC.

FIG. 2 shows a flowchart of another example process for configuration of a programmable IC. Programmable resources are configured over a plurality of stages by performing partial configuration/reconfiguration of programmable resources in each stage. A first configuration stage is performed at blocks 202 and 204. At block 202, a first set of configuration data is loaded into a programmable IC using a configuration data port. At block 204, programmable resources are configured with the first set of configuration data to implement a master PCIe data link and a slave PCIe data link. A second configuration stage is performed at blocks 206 and 208. At block 206, the master PCIe data link is used to receive a second set of configuration data. Programmable resources are configured using the second set of configuration data at block 208 to implement a first logic circuit (e.g., a first portion of a circuit design). The first logic circuit may be configured to use the slave PCIe data link for communication. The first logic circuit and slave PCIe are operated at block 210.

In this example, a third configuration stage is performed at blocks 212 and 214 to reconfigure programmable resources according to a third set of configuration data. At block 212, a third set of configuration data is received using the master PCIe data link. Depending on the set of configuration data, the reconfiguration of the programmable resources at block 212 may reconfigure the logic circuitry and/or reconfigure the slave PCIe circuit. As one example, the slave PCIe circuit may initially be configured to provide a communication channel that is one PCIe data lane wide. The slave PCIe circuit may be reconfigured by the third set of configuration data to provide a communication channel that is four PCIe data lanes wide. In another example, programmable resources used to implement the slave PCIe circuit may be repurposed to implement a second logic circuit indicated by the third set of configuration data.

Figure 3:
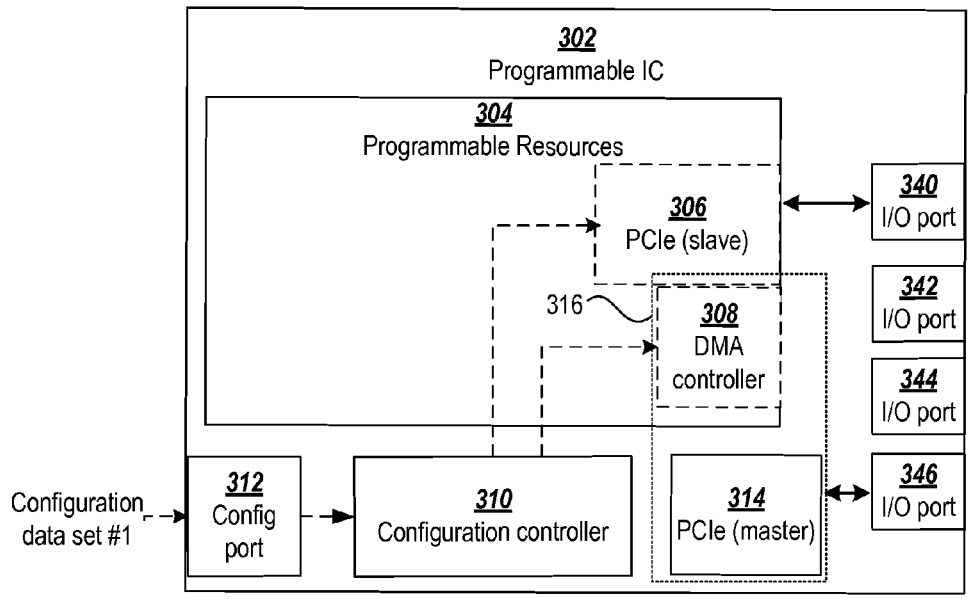
FIG. 3 shows configuration of an example programmable IC in a first configuration stage.

FIGS. 3-6 illustrate programmable resources 304 of a programmable IC 302 at various stages of configuration. FIG. 3 shows configuration of an example programmable IC in a first example configuration stage. In this stage, a first set of configuration data is received by a configuration control circuit (e.g., configuration controller 310) using configuration port 312. The programmable IC 302 includes a set of programmable resources 304 that may be programmed to implement various logic circuits. The programmable IC also includes multiple input/output (I/O) ports (e.g., 340, 342, 344, and 346) that may be used by the programmable resources 304 to communicate data using various communication protocols (e.g., JTAG, PCIe, and Ethernet). In this example, the first set of configuration data causes the configuration controller 310 to program the programmable resources to implement a communication control circuit (DMA control circuit 308) for a PCIe communication circuit 314 that is hardwired in the programmable IC 302. A hardwired circuit refers to a circuit whose function is fixed and not programmable such as with configuration memory for programmable logic and programmable routing resources. The DMA control circuit 308 and PCIe communication circuit 314 operate together as a master PCIe data link 316 that is configured to communicate data over I/O port 346. In some implementations, both the DMA control circuit 308 and the PCIe communication circuit 314 may be implemented by the programmable resources 304. Programming of programmable resources is illustrated as dashed lines in the figure. In this example, the first set of configuration data also causes the configuration controller 310 to program programmable resources to implement a slave PCIe data link 306 that is configured to communicate data over I/O port 340.

Figure 4:
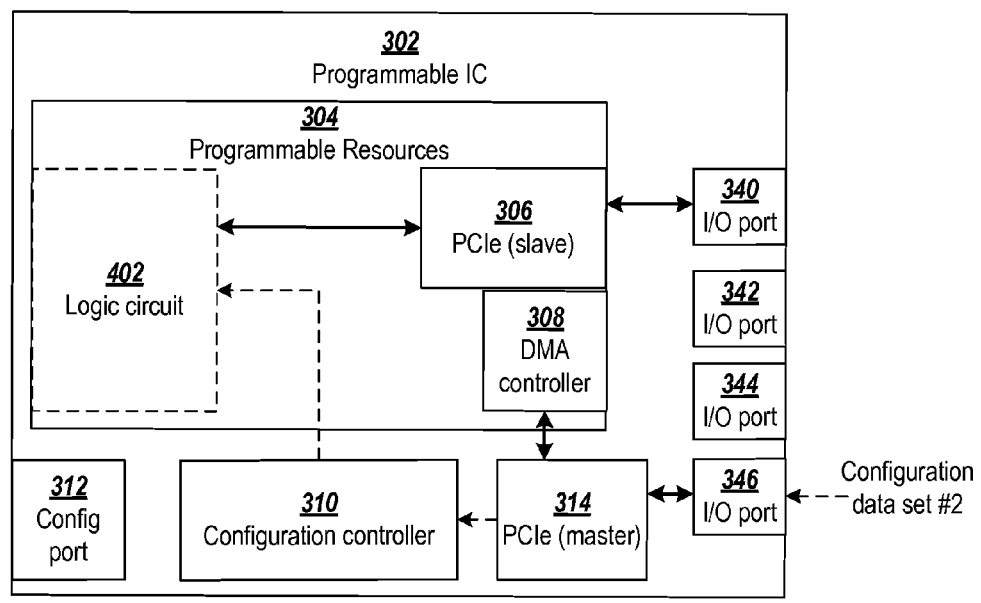
FIG. 4 shows the programmable IC of FIG. 3 in a second configuration stage.

FIG. 4 shows the programmable IC of FIG. 3 in a second example configuration stage. In the second configuration stage, a second set of configuration data is received by a configuration 310 controller using I/O port 346 and the master PCIe data link 314 under control of the DMA controller 308. In this example, the second set of configuration data causes the configuration controller 310 to program the programmable resources 304 to implement a first logic circuit 402 that communicates data over the slave PCIe data link 306.

Figure 5:
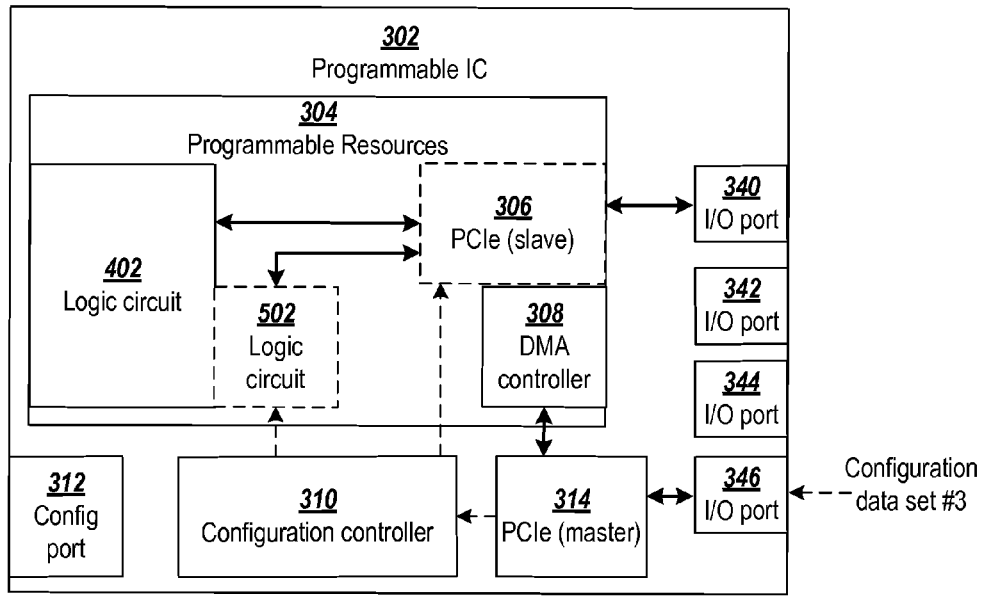
FIG. 5 shows the programmable IC of FIG. 4 in a third configuration stage.

FIG. 5 shows the programmable IC of FIG. 4 in a third example configuration stage. In the third configuration stage, a third set of configuration data is received by a configuration controller 310 using I/O port 346 and the master PCIe data link 314 under control of the DMA controller 308. In this example, the second set of configuration data causes the configuration controller 310 to program the programmable resources 304 to implement a second logic circuit 502. The second set of configuration data in this example also causes the configuration controller 310 to reconfigure the slave PCIe data link 306 to provide a communication channel for the second logic circuit 502.

Figure 6:
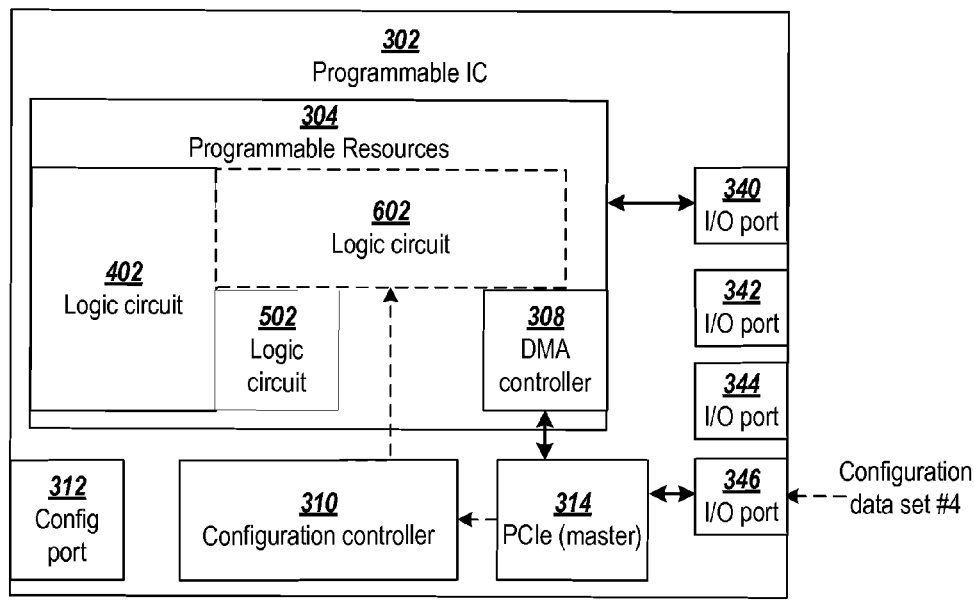
FIG. 6 shows the programmable IC of FIG. 5 in a fourth configuration stage.

FIG. 6 shows the programmable IC of FIG. 5 in a fourth example configuration stage. In the fourth configuration stage, a fourth set of configuration data is received by a configuration 310 controller using I/O port 346 and the master PCIe data link 314 under control of the DMA controller 308. In this example, the fourth set of configuration data causes the configuration controller 310 to reconfigure the programmable resources 304 to remove slave PCIe data link 306 and implement a third logic circuit 602.

The example configuration stages shown in FIGS. 3-6 are provided for illustrative purposes. Depending on the circuit design to be implemented, programmable resources may be performed over various numbers of configuration stages and may implement a number of different logic circuits.

Figure 7:
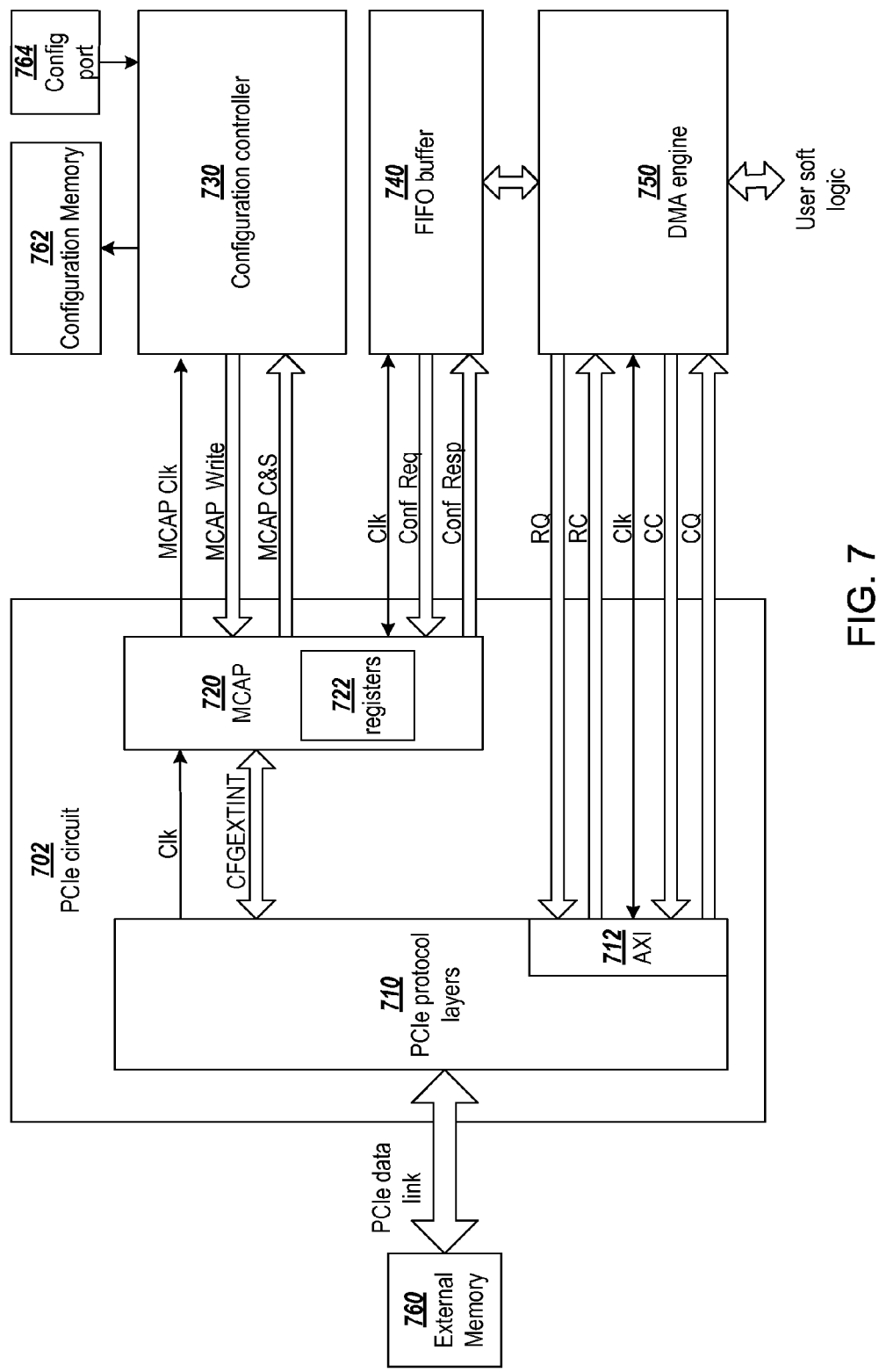
FIG. 7 shows circuits for communication of configuration data over a PCIe data link in a DMA mode to a configuration controller of a programmable IC.

FIG. 7 shows a circuit for communication of configuration data over a PCIe data link in DMA mode to a configuration controller of a programmable IC. Configuration controller 730 is configured to program configuration memory 762 according to configuration data received via configuration port 764 or PCIe circuit 702. PCIe circuit 702 provides a PCIe data link to an external memory (e.g., containing configuration data). The PCIe circuit includes logic to implement various PCIe protocol layers (e.g., physical layer, data link layer, and transaction layer).

The PCIe circuit 702 is configurable to operate in either a DMA mode or a non-DMA mode. For instance, the PCIe circuit 702 may be configured to switch between the DMA and non-DMA modes in response to a control signal (not shown) provided by DMA engine 750. When the PCIe circuit 702 is operated in the first non-DMA mode, media control access port (MCAP) circuit 720 provides configuration data from the PCIe protocol layers 710 to configuration controller 730. MCAP circuit 720 includes a set of registers 722 that are used to communicate data and status of transactions. When the PCIe circuit 702 is operated in the DMA mode, DMA engine 750 controls the PCIe circuit 702 to receive a set of configuration data from the external memory 760 via AXI interface 712 using DMA burst mode transactions. The DMA engine 750 places received configuration data in first-in-first-out (FIFO) buffer 740. MCAP circuit 720 communicates data transactions (e.g., configuration data or status) between the FIFO buffer 740 and the configuration controller 730 via registers 722. Use of FIFO buffer 740, allows sequences of configuration data to be received at burst rates that are faster than a rate that the data can be written to configuration memory via the MCAP circuit 720 and configuration controller 730.

Figure 8:
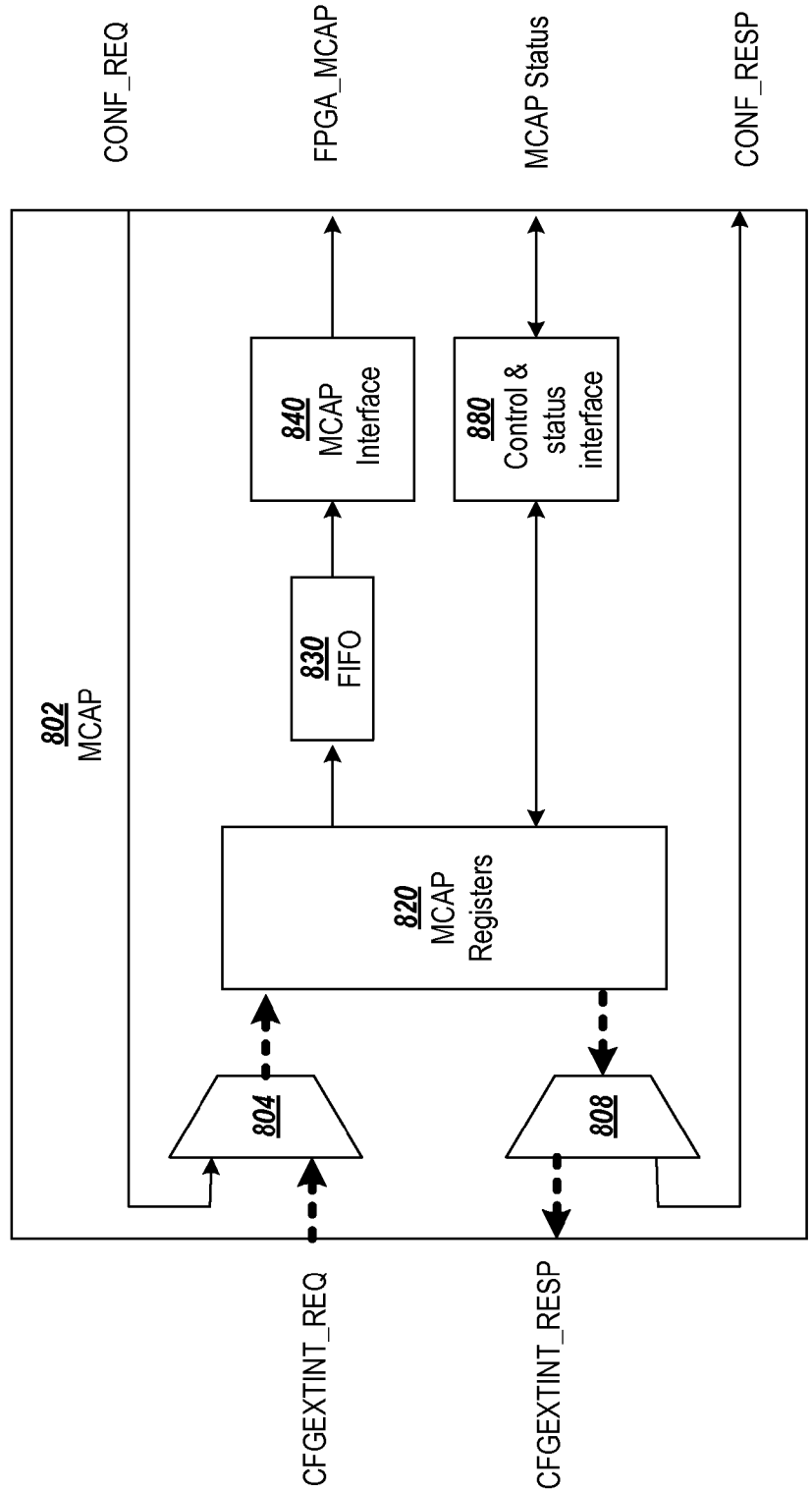
FIG. 8 shows data flow through an MCAP circuit for communication of configuration control and status requests from the PCIe data link.
Figure 9:
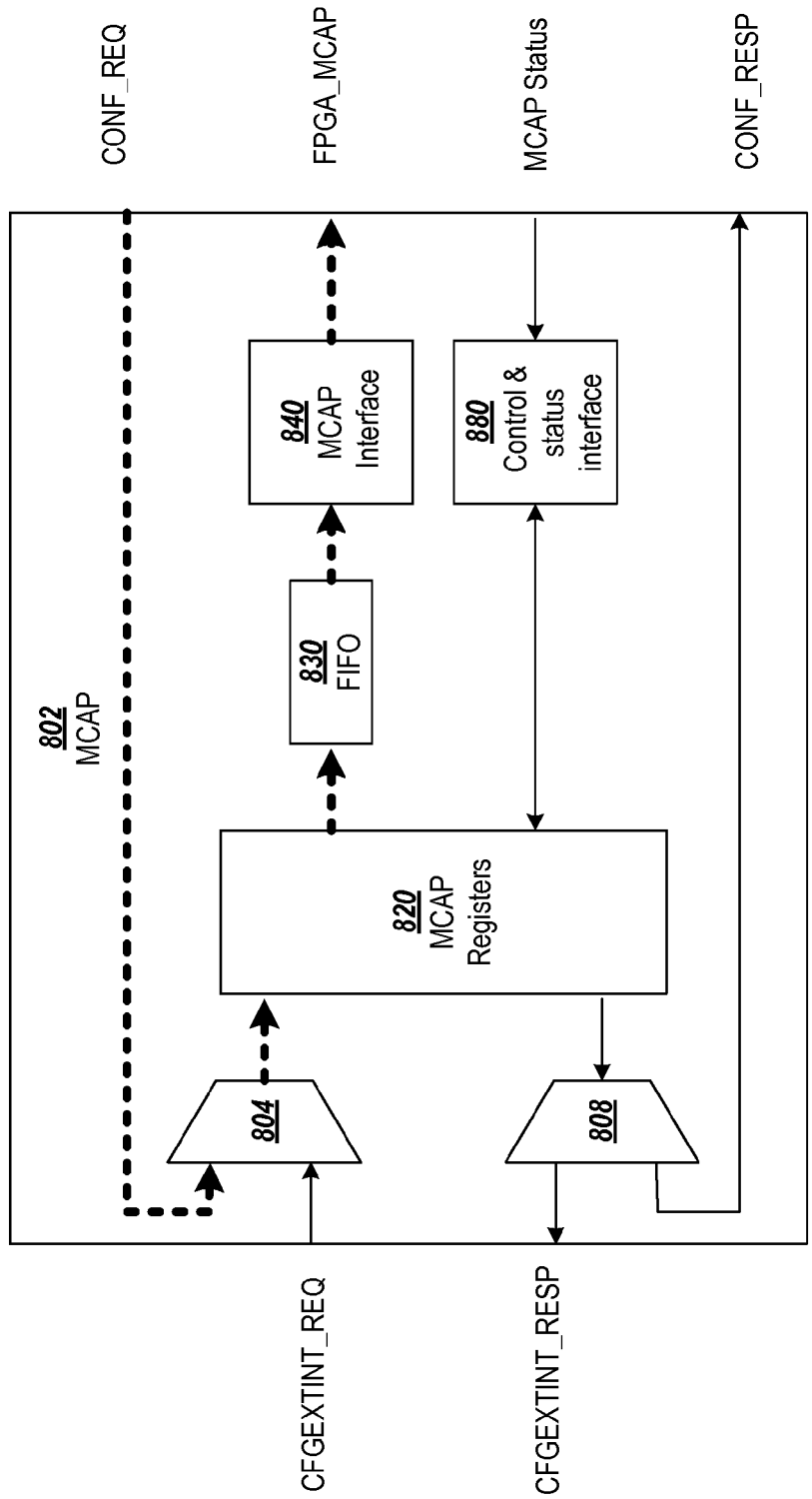
FIG. 9 shows data flow through the MCAP circuit in FIG. 8 for configuration data received over the PCIe data link.
Figure 10:
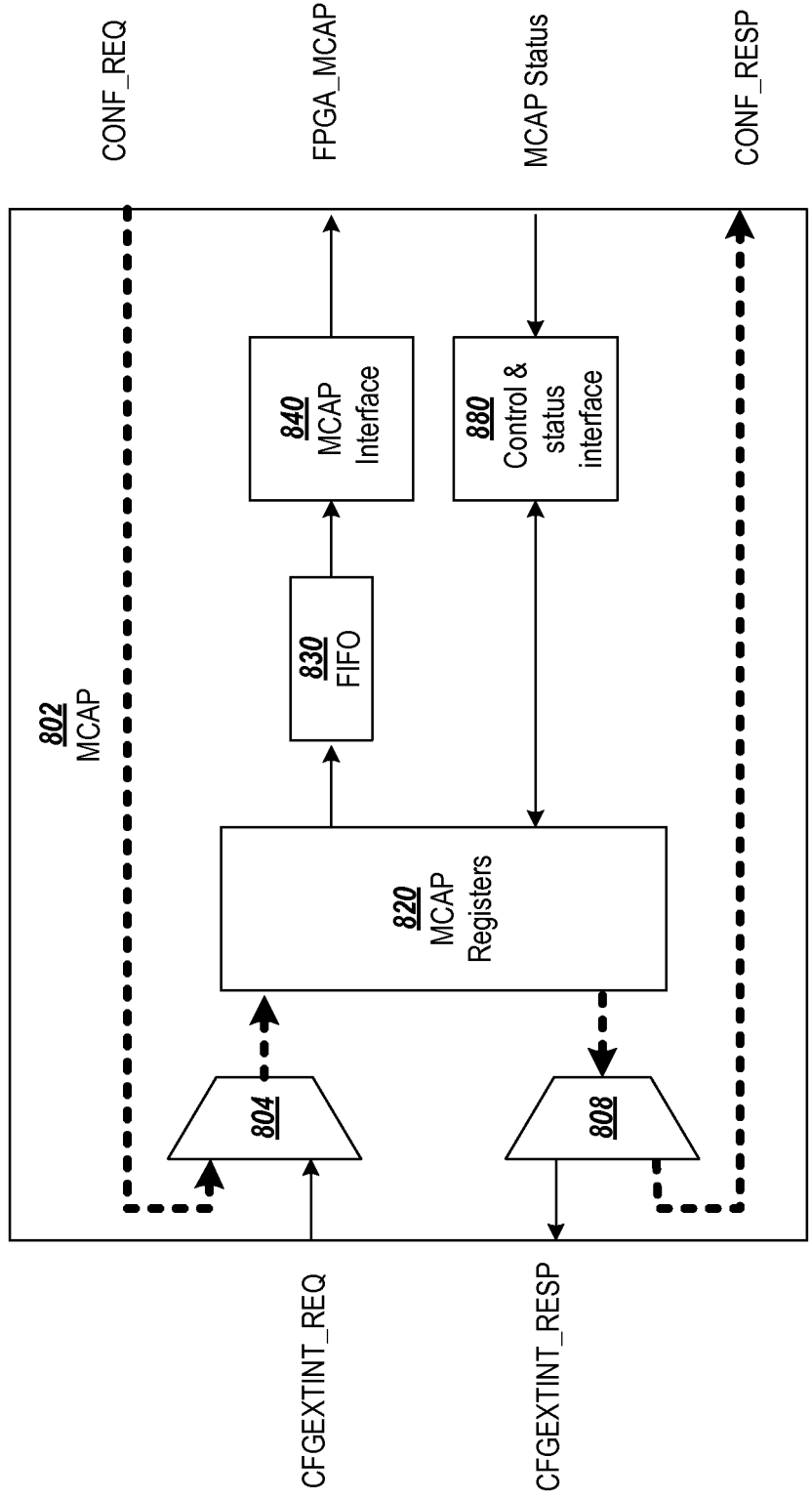
FIG. 10 shows data flow through the MCAP circuit in FIG. 8 for communication of status requests from the DMA controller.

FIGS. 8-10 illustrate data flow through an example MCAP circuit for various control, status, and data messages. FIG. 8 shows data flow through an MCAP circuit for communication of configuration control and status requests from a PCIe data link. The MCAP circuit 802 may be used to implement the MCAP circuit 720 in FIG. 7. The MCAP circuit 802 includes a set of registers (MCAP registers 820) that are used to buffer command status and data of configuration data transactions. In one implementation, the registers 820 includes registers for a PCIe extended capability header, a vendor-specific header, an FPGA JTAG ID, an FPGA data stream version, status values, control values, and data values. During operation, data is transferred from the set of registers 820 to a configuration output FPGA_MCAP (e.g., connected to configuration controller 730 or other logic circuit) via FIFO buffer 830 and MCAP interface 840. Values may be read from and written to control and status registers by a configuration controller via input MCAP STATUS and control and status interface 880.

The MCAP circuit includes multiplexers 804 and 808 that are configured to route PCIe request and response messages and transfer configuration data between registers 820 and MCAP inputs and outputs. When operating in a non-DMA mode (e.g., programmed I/O mode), the multiplexers are configured to route request and response messages between the registers 820 and inputs CFGEXTINT_REQ and CFGEXTINT_RESP (e.g., connected to PCIe protocol layers 710). When operating in a DMA mode, the multiplexers are configured to route request and response messages between the registers 820 and inputs CONF_REQ and CONF_RESP (e.g., connected to FIFO buffer 740).

The bold dashed lines in FIGS. 8-10 illustrate example data flow of various control, status, and data messages through the MCAP circuit 802. The bold dashed lines in FIG. 8 illustrate data flow of configuration control and status requests from the PCIe data link. For instance, a status request to read the value of a status register may be received from the PCIe protocol layers 710 on input CFGEXTING_REQ. The read request is routed to the registers 820 by multiplexer 804. A response from MCAP registers 720, indicating the state of the indicated register, is routed to output CFGEXTINT_RESP by multiplexer 808.

The bold dashed lines in FIG. 9 illustrate data flow through the MCAP circuit 802 for configuration data received over the PCIe data link. For instance, referring again to FIG. 7, configuration data may be transferred from FIFO 740 to the set of MCAP registers 820 via input CONF_REQ. The data is transferred from the MCAP registers 820 to configuration controller 730 via FIFO 830, MCAP interface 840 and the output FPGA_MCAP.

The bold dashed lines in FIG. 10 illustrate data flow through the MCAP circuit 802 for communication of status requests from the DMA controller. For instance, referring again to FIG. 7, DMA engine 750 may communicate a status request to input port CONF_REQ via FIFO buffer 740. Multiplexer 804 routes the status request to the MCAP registers 820. A status response from MCAP registers 720, indicating the state of the requested register, is routed to the output CONF_RESP by multiplexer 808.

Tables 1 and 2 describe some control and status signals that may be used for communication of configuration data and status requests in one example implementation the MCAP circuit 802 shown in FIG. 8. Table 1 describes a set of signals that may be used by MCAP interface 840 in one example implementation. Table 2 describes a set of signals that may be used by MCAP interface 840 in an example implementation.

TABLE 1

| Name | Direction | Width | Description |
| --- | --- | --- | --- |
| conf_req_type | Input | 2 | Configure Request Type:<br>00b -- No Action<br>01b -- Read Register<br>10b -- Write Register<br>11b -- Reserved |
| conf_req_reg_num | Input | 4 | Configure Request Register Number: - Configure Request Register Number 0-9, where Reg#0 corresponds to the MCAP VSEC Vendor Specific Header Register. Register #s AH-FH are reserved. |
| conf_req_data | Input | 32 | Configure Request Data Input: Configure Register Data Write |
| conf_req_valid | Input | 1 | Configure Request Valid: Configure Request valid |
| conf_req_ready | Output | 1 | Configure Request Ready: Configure Request interface ready |
| conf_resp_rdata | Output | 32 | Configure Response Data Output: Response Data Output |
| conf_resp_valid | Output | 1 | Configure Response Data Valid: Response Data valid |
| conf_mcap_design_switch | Output | 1 | Configure MCAP Design Switch: Combined Configuration Design Switch Register bit |
| conf_mcap_eos | Output | 1 | Configure MCAP EOS: MCAP EOS Output. mcap_eos to FPGA fabric. |
| conf_mcap_in_use_by_pcie | Output | 1 | Configure MCAP Is In Use By PCIe Link: Active High. When asserted, PCIe is actively using MCAP. Driven from MCAP Control Register Configure MCAP In Use By PCIe bit. |
| conf_mcap_request_by_conf | Input | 1 | Configure MCAP Access Request by Configure: Active High. Configure interface granted access to MCAP if, conf_mcap_in_use_by_pcie is 0b. If conf_mcap_in_use_by_pcie 1b when asserted, then Confgure must wait for conf_mcap_in_use_by_pcie to transition to 0b. Must be de-asserted when not actively using Configure interface. |

TABLE 2

| Name | Direction | Width | Description |
| --- | --- | --- | --- |
| mcap_mode | Output | 1 | MCAP Mode: Active High. mcap_wdata_clk must be valid before asserting this signal. When asserted, MCAP interface is enabled. All external FPGA programming ports excluding JTAG, will be disabled except MCAP. It is User responsibility to avoid any conflict between MCAP and other programming ports (like ICAP). |
| mcap_wdata | Output | 32 | MCAP Write Data: Output from PCIe to FPGA Configuration. |
| mcap_cs_b | Output | 1 | MCAP Chip Select: Active Low. Indicates mcap_wdata data is valid at current cycle for transferring data between PCIe and FPGA Configuration. |

TABLE 2-continued

| Name | Direction | Width | Description |
|---|---|---|---|
| mcap_rdwr_b | Output | 1 | MCAP Read: Low indicates write command on mcap_wdata, High indicates read command on mcap_wdata. Read commands support reading of one or more 32b FPGA configuration control and status registers. |
| mcap_eos | Input | 1 | MCAP EOS: Active High. Asserted when FPGA configuration controller has completed configuring the partial FPGA bit-stream that was transferred over MCAP. |
| mcap_error | Input | 1 | MCAP Error: Active High. Asserted when FPGA configuration controller has detected an uncorrectable error in the bit-stream. The sources of uncorrectable errors include CRC, IDCODE, Authentication and other error. |
| mcap_reset | Output | 1 | MCAP Reset: Active High. Used to clear mcap_error so as to initiate RELOAD (PCIe reload). Resets config registers including word count, but does not initiate house cleaning. |
| mcap_rdata_valid | Input | 1 | MCAP Read Data Valid: Active High. Asserted when FPGA configuration is presenting valid data on mcap_rdata in response to high on mcap_rdwr_b. |
| mcap_rdata | Input | 32 | MCAP Read Data : Output from FPGA Configuration to PCIe. When mcap_rdwr_b is 0b, FPGA Configuration will drive JTAG ID: vvvv:fffffff:aaaaaaaaa:ccccccccccc1 where: v = 4-bit version; f = 7-bit family code; a = 9-bit array code (4-bit sub-family and 5-bit device code); c = 11-bit company code. When mcap_rdwr_b and mcap_rdata_valid are both 1b, mcap_rdata contains FPGA configuration register read response data. |

Referring again to the configuration processes described with reference to FIG. 1-6, in various implementations, the master/slave PCIe data links may be implemented using programmable resources alone or in combination with various circuits hardwired in the programmable IC. For instance, in one implementation, a master or slave PCIe data link may be implemented using the PCIe circuit 702, which is hardwired in the programmable IC and DMA engine 750 and FIFO buffer 740, which are implemented by programmable resources of the programmable IC. In another implementation, a master or slave PCIe data link may be implemented by configuring programmable resources to implement the PCIe circuit 702, the DMA engine 750, and the FIFO buffer 740. Other implementations are also possible.

Figure 11:
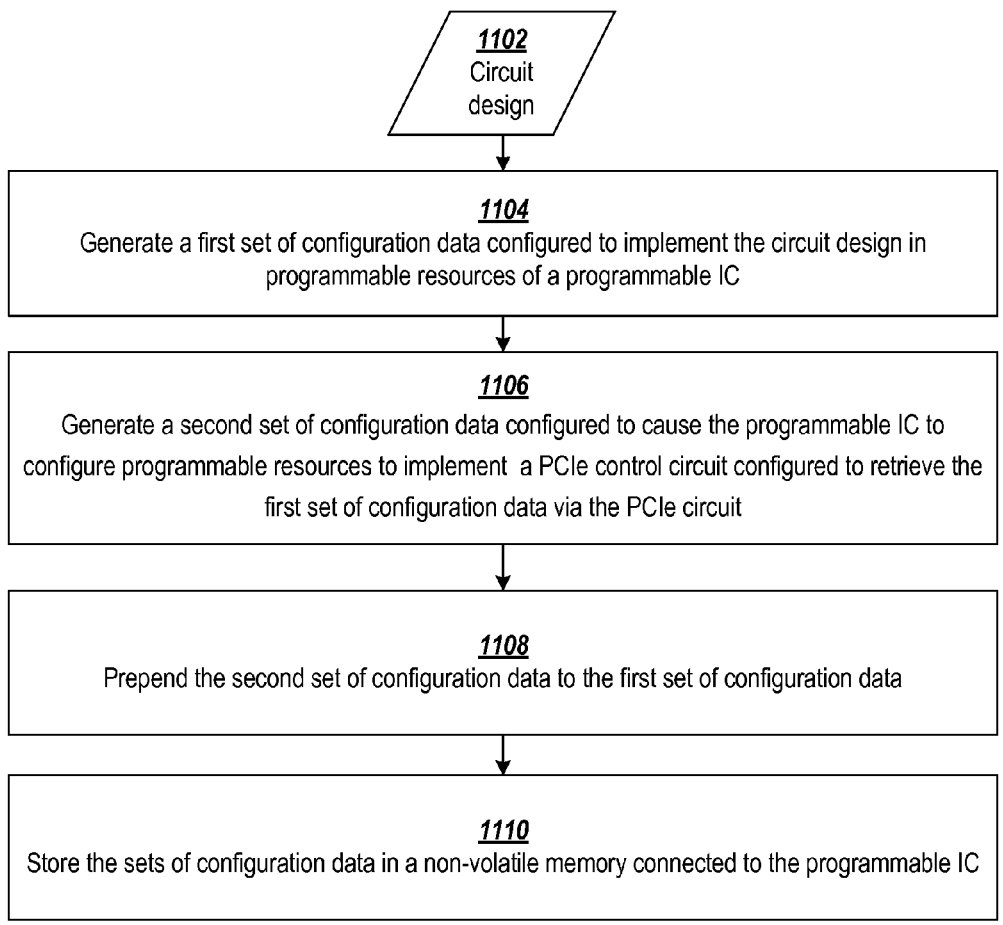
FIG. 11 shows a flowchart of a process for generation of configuration data for a circuit design.

FIG. 11 shows a flowchart of a process for generation of a configuration data stream for a circuit design, to configure a programmable IC with the circuit design. At block 1104, a first set of configuration data is generated that is configured to implement a circuit design 1102 in programmable resources of a programmable IC. At block 1106, a second set of configuration data is generated that is configured to cause the programmable IC to configure the programmable resources to implement a PCIe control circuit. The control circuit is configured to retrieve the first set of configuration data via a PCIe circuit. The second set of configuration data is prepended to the first set of configuration data at block 1108. At block 1110, the sets of configuration data are stored in a non-volatile memory connected to the programmable IC. During configuration of the programmable IC, configuration data is retrieved from the non-volatile memory over a plurality of configuration stages as described above.

Figure 12:
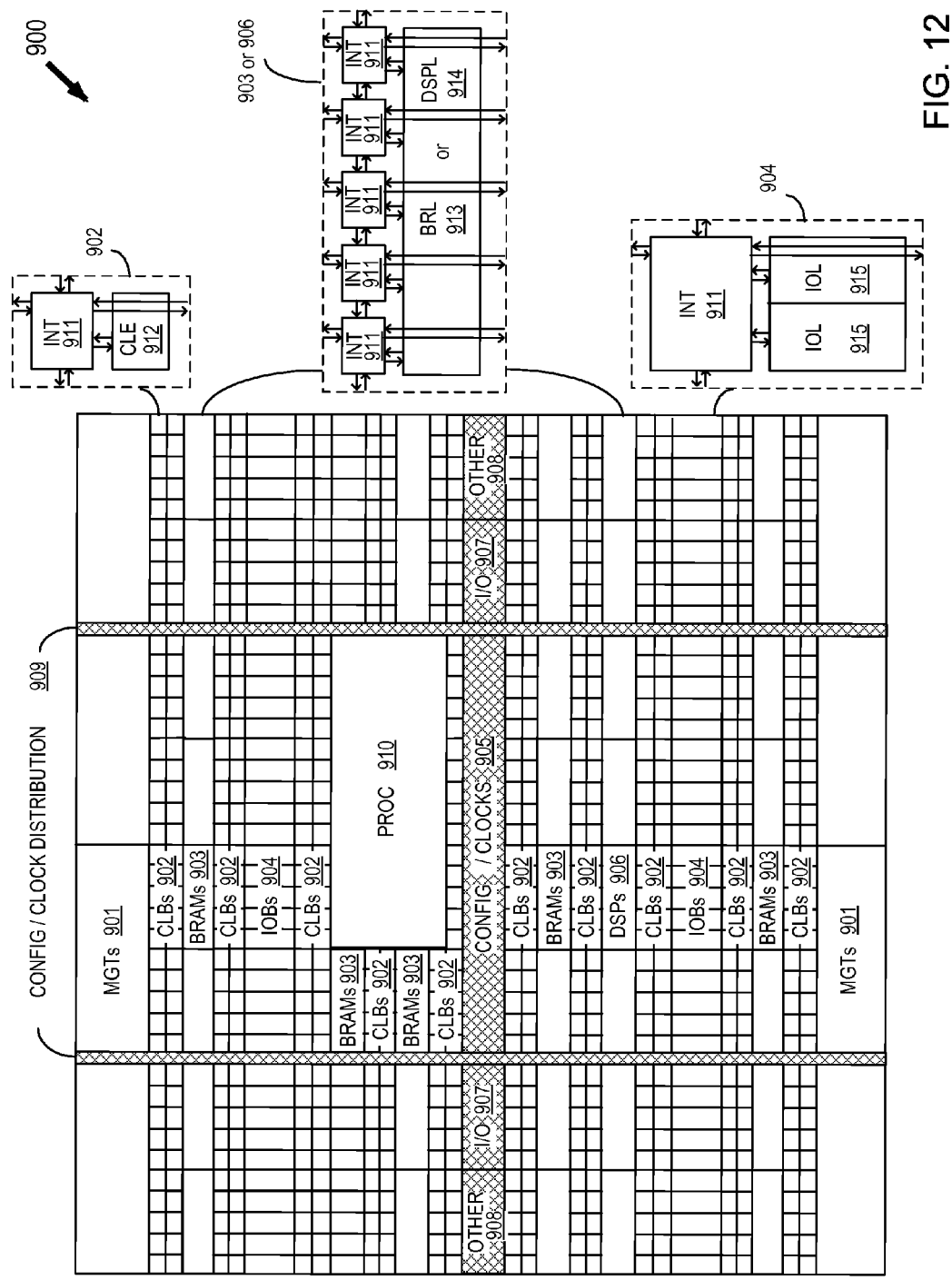
FIG. 12 shows an example programmable IC that may be configured with the disclosed processes.

FIG. 12 shows an example programmable IC that may be configured according to the disclosed processes. As previously described, an FPGA is one type of programmable IC that may be used to implement circuit design programmable resources. FPGAs can include several different types of programmable logic blocks in the array. For example, FIG. 12 illustrates an FPGA architecture (900) that includes a large number of different programmable tiles including multi-gigabit transceivers (MGTs 901), configurable logic blocks (CLBs 902), random access memory blocks (BRAMs 903), input/output blocks (IOBs 904), configuration and clocking logic (CONFIG/CLOCKS 905), digital signal processing blocks (DSPs 906), specialized input/output blocks (I/O 907), for example, e.g., clock ports, and other programmable logic 908 such as digital clock managers, analog-to-digital converters, system monitoring logic, and so forth. Some FPGAs also include dedicated processor blocks (PROC 910) and internal and external reconfiguration ports (not shown).

In some FPGAs, each programmable tile includes a programmable interconnect element (INT 911) having standardized connections to and from a corresponding interconnect element in each adjacent tile. Therefore, the programmable interconnect elements taken together implement the programmable interconnect structure for the illustrated FPGA. The programmable interconnect element INT 911 also includes the connections to and from the programmable logic element within the same tile, as shown by the examples included at the top of FIG. 12.

For example, a CLB 902 can include a configurable logic element CLE 912 that can be programmed to implement user logic plus a single programmable interconnect element INT 911. A BRAM 903 can include a BRAM logic element (BRL 913) in addition to one or more programmable interconnect elements. Typically, the number of interconnect elements included in a tile depends on the width of the tile. In the pictured FPGA, a BRAM tile has the same width as five CLBs, but other numbers (e.g., four) can also be used. A DSP tile 906 can include a DSP logic element (DSPL 914) in addition to an appropriate number of programmable interconnect elements. An IOB 904 can include, for example, two instances of an input/output logic element (IOL 915) in addition to one instance of the programmable interconnect element INT 911. As will be clear to those of skill in the art, the actual I/O pads connected, for example, to the I/O logic element 915 are manufactured using metal layered above the various illustrated logic blocks, and typically are not confined to the area of the input/output logic element 915.

In the pictured FPGA, a horizontal area near the center of the die (shown shaded in FIG. 12) is used for configuration, clock, and other control logic. Vertical areas 909 extending from this horizontal area are used to distribute the clocks and configuration signals across the breadth of the FPGA.

Some FPGAs utilizing the architecture illustrated in FIG. 12 include additional logic blocks that disrupt the regular row structure making up a large part of the FPGA. The additional logic blocks can be programmable blocks and/or dedicated logic. For example, the processor block PROC 910 shown in FIG. 12 spans several rows of CLBs and BRAMs.

Note that FIG. 12 is intended to illustrate only an exemplary FPGA architecture. The numbers of logic blocks in a row, the relative heights of the rows, the number and order of rows, the types of logic blocks included in the rows, the relative sizes of the logic blocks, and the interconnect/logic implementations included at the top of FIG. 12 are purely exemplary. For example, in an actual FPGA more than one adjacent row of CLBs is typically included wherever the CLBs appear, to facilitate the efficient implementation of user logic.

The methods and systems described herein are thought to be applicable to a variety of systems that utilize programmable ICs. Other aspects will be apparent to those skilled in the art from consideration of the specification. For instance, although examples may in some cases be described in individual figures, it will be appreciated that features from one figure can be combined with features of another figure even though the combination is not explicitly shown or explicitly described as a combination. The systems and methods may be implemented as one or more processors configured to execute software, as an application specific integrated circuit (ASIC), or as a logic on a programmable logic device. It is intended that the specification and illustrated processes and circuits be considered as examples only, with a true scope of the invention being indicated by the following claims.

What is claimed is:

1. A method of configuring programmable resources of a programmable integrated circuit (IC), comprising:
    loading a first set of configuration data into the programmable IC using a configuration port of the programmable IC, the programmable IC including a plurality of input/output (I/O) ports and the configuration port;
    configuring programmable resources of the programmable IC according to the first set of configuration data to implement a master data link circuit and at least one slave data link circuit, the master data link circuit including:
        a communication circuit hardwired in the programmable IC; and
        a set of the programmable resources of the programmable IC arranged to form a communication control circuit configured to control the communication circuit to provide a data link for communicating data via a first one of the plurality of I/O ports;
    loading a second set of configuration data using the master data link circuit; and
    configuring the programmable resources of the programmable IC according to the second set of configuration data to implement a first logic circuit that is configured to communicate data via the slave data link circuit.

2. The method of claim 1, wherein the loading of the second set of configuration data includes:
    using the data link to provide the second set of configuration data to a first-in-first-out (FIFO) buffer configured in the programmable resources of the programmable IC;
    communicating the second set of configuration data from the FIFO buffer to a set of registers of the communication circuit; and
    communicating the second set of configuration data from the set of registers of the communication circuit to a configuration control circuit of the programmable IC.

3. The method of claim 2, wherein loading of the second set of configuration data is initiated by the master data link circuit.

4. The method of claim 1, further comprising:
    operating the first logic circuit to communicate data over a second one of the plurality of I/O ports using the slave data link circuit; and
    concurrently with the operating the first logic circuit:
        loading a third set of configuration data using the master data link circuit; and
        configuring programmable resources of the programmable IC according to the third set of configuration data to implement a second logic circuit.

5. The method of claim 1, further comprising reconfiguring programmable resources of the programmable IC to replace the slave data link circuit with a second logic circuit by performing operations including:
    loading a third set of configuration data using the master data link circuit and the first I/O port; and
    configuring programmable resources of the programmable IC with the third set of configuration data to implement the second logic circuit, the configured programmable resources including programmable resources of the programmable IC used to implement the slave data link circuit.

6. The method of claim 5, wherein the second logic circuit is configured to communicate data in a non-burst mode using the master data link circuit.

7. The method of claim 5, wherein the second logic circuit is configured to communicate data in a burst mode using the master data link circuit.

8. The method of claim 1, further comprising:
    using the master data link circuit, in response to a control signal having a first value, receiving configuration data over the first I/O port according to a first communication protocol, the first communication protocol communicating individual packets of the second set of configuration data from an external memory to the master data link circuit in a non-burst mode; and
    using the master data link circuit, in response to the control signal having a second value, receiving configuration data over the first I/O port according to a second communication protocol, the second communication protocol communicating multiple ones of the packets of the second set of configuration data from an external memory to the master data link circuit in a burst-mode.

9. A method for generating configuration data for a programmable integrated circuit (IC), comprising:
    in response to receiving a circuit design, generating a first set of configuration data, wherein programmable resources of a programmable IC when configured with the first set of configuration data implement the circuit design;
    generating a second set of configuration data, wherein the programmable IC having programmable resources configured with the second set of configuration data is configured to:

program programmable resources of the programmable IC to implement a data link circuit;

retrieve the first set of configuration data from a non-volatile memory coupled to the programmable IC as a contiguous sequence of data in a burst mode using the data link circuit; and program programmable resources of the programmable IC using the first set of configuration data; and storing the first and second sets of configuration data in the non-volatile memory.

10. The method of claim 9, further comprising:

configuring the programmable resources of the programmable IC using the second set of configuration data to implement the data link circuit; and using a control circuit of the data link circuit, initiating communication of the first set of configuration data from the non-volatile memory to the data link circuit.

11. The method of claim 9, further comprising:

configuring the programmable resources of the programmable IC using the second set of configuration data to implement the data link circuit, the data link circuit including a control circuit coupled to a communication circuit that is hardwired in the programmable IC; and using the control circuit and communication circuit to provide a data link for communicating data between the non-volatile memory and the programmable IC.

12. The method of claim 11, further comprising, using the control circuit:

retrieving the first set of configuration data from a non-volatile memory coupled to the programmable IC using the communication circuit hardwired in the programmable IC; and communicating the first set of configuration data to a configuration control circuit of the programmable IC via a set of registers of the communication circuit hardwired in the programmable IC.

13. An integrated circuit, comprising:

a plurality of input/output (I/O) ports;

a set of programmable resources, the programmable resources programmed to implement a communication control circuit;

a configuration control circuit configured to program the programmable resources in response to a set of configuration data; and a communication circuit configured to communicate data over one of the plurality of I/O ports, the communication circuit including:

a first circuit coupled to the one I/O port and configured to communicate data over the one I/O port according to a communication protocol; and a second circuit coupled to the first circuit, the second circuit configured to:

in response to the communication control circuit operating in a first mode, provide data from the first circuit to the configuration control circuit; and in response to the communication control circuit operating in a second mode, provide data from the communication control circuit to the configuration control circuit;

wherein the communication control circuit is configured to, while operating in the second mode:

enable the communication circuit to receive the set of configuration data in a burst mode and provide the set of configuration data to the communication control circuit; and communicate the set of configuration data to the configuration control circuit via the second circuit of the communication circuit.

14. The integrated circuit of claim 13, wherein the set of programmable resources are further programmed to implement a second communication circuit configured to communicate data over a second one of the plurality of I/O ports.

15. The integrated circuit of claim 14, wherein the set of configuration data is configured to cause the configuration control circuit to program the programmable resources to implement a logic circuit that communicates data using the second communication circuit.

16. The integrated circuit of claim 15, wherein the logic circuit is configured to communicate data in a burst mode using the second communication circuit.

17. The integrated circuit of claim 16, wherein the communication control circuit is further configured to, during operation of the logic circuit:

enable the communication circuit to receive a second set of configuration data in a burst mode; and provide the set of configuration data to the configuration control circuit via the second circuit of the communication circuit.

18. The integrated circuit of claim 17, wherein the second set of configuration data is configured to enable the configuration control circuit to reprogram a subset of the programmable resources, used to implement the second communication circuit, to implement a second logic circuit.

19. The integrated circuit of claim 18, wherein the second logic circuit is configured to communicate data using the second communication circuit operating in the first mode.

20. The integrated circuit of claim 18, wherein the second logic circuit is configured to communicate data using the second communication circuit operating in the second mode.

* * * * *